(12) United States Patent
Shi et al.

(10) Patent No.: US 11,251,044 B2
(45) Date of Patent: Feb. 15, 2022

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wei Shi, Shanghai (CN); Youcun Hu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 13 days.

(21) Appl. No.: 16/802,891

(22) Filed: Feb. 27, 2020

(65) Prior Publication Data

US 2020/0279738 A1    Sep. 3, 2020

(30) Foreign Application Priority Data

Mar. 1, 2019  (CN) .......................... 201910156243.7

(51) Int. Cl.
| | |
|---|---|
| *H01L 21/033* | (2006.01) |
| *H01L 21/3115* | (2006.01) |
| *H01L 21/311* | (2006.01) |
| *H01L 21/768* | (2006.01) |
| *H01L 23/528* | (2006.01) |
| *H01L 21/027* | (2006.01) |

(52) U.S. Cl.
CPC ...... *H01L 21/0337* (2013.01); *H01L 21/0332* (2013.01); *H01L 21/31111* (2013.01); *H01L 21/31144* (2013.01); *H01L 21/31155* (2013.01); *H01L 21/76802* (2013.01); *H01L 21/76877* (2013.01); *H01L 23/528* (2013.01); *H01L 21/0276* (2013.01)

(58) Field of Classification Search
CPC ............. H01L 21/0337; H01L 21/0332; H01L 21/31155; H01L 21/31144; H01L 21/76802; H01L 23/528
See application file for complete search history.

(56) References Cited

U.S. PATENT DOCUMENTS 9,536,778 B2 * 1/2017 Yuan ................. H01L 23/53257
9,786,545 B1 * 10/2017 Bouche ............... H01L 27/0251
(Continued)

*Primary Examiner* — Bac H Au
(74) *Attorney, Agent, or Firm* — Anova Law Group, PLLC

(57) ABSTRACT

A method for fabricating a semiconductor device includes providing a to-be-etched layer, including alternately arranged first regions and second regions along a first direction; forming a first mask layer on the to-be-etched layer; and forming a top mask layer on the first region and extending to the second region along the first direction. The projection pattern of the top mask layer divides the first mask layer formed on the first region into portions arranged in a second direction that is perpendicular to the first direction. The method further includes removing a portion of the first mask layer formed on the first region on both sides of the top mask layer to form a first trench. The first mask layer on the first region under the top mask layer forms a separation mask layer which divides the first trench into portions arranged in the second direction.

14 Claims, 13 Drawing Sheets

(56) References Cited

U.S. PATENT DOCUMENTS

| | | | | |
|---|---|---|---|---|
| 10,083,858 B2* | 9/2018 | Licausi | ............ | H01L 21/76816 |
| 10,141,330 B1* | 11/2018 | Lindsay | ............ | H01L 21/76831 |
| 11,049,768 B2* | 6/2021 | Hopkins | ........... | H01L 21/76802 |
| 2011/0062595 A1* | 3/2011 | Sim | ................... | H01L 21/31144 |
| | | | | 257/775 |
| 2012/0058640 A1* | 3/2012 | Kim | ................. | H01L 21/31144 |
| | | | | 438/675 |
| 2013/0230981 A1* | 9/2013 | Kawamura | ....... | H01L 21/76897 |
| | | | | 438/637 |
| 2014/0024219 A1* | 1/2014 | Jung | ................. | H01L 21/31144 |
| | | | | 438/703 |
| 2014/0291858 A1* | 10/2014 | Bouton | .............. | H01L 21/0337 |
| | | | | 257/774 |
| 2015/0170961 A1* | 6/2015 | Romero | ........... | H01L 21/76816 |
| | | | | 438/641 |
| 2015/0206882 A1* | 7/2015 | Chen | ................ | H01L 27/11582 |
| | | | | 365/63 |
| 2015/0380300 A1* | 12/2015 | Wu | .................... | H01L 21/3081 |
| | | | | 438/618 |
| 2016/0049307 A1* | 2/2016 | Chen | .................. | H01L 21/0337 |
| | | | | 438/696 |
| 2016/0190009 A1* | 6/2016 | Wallace | ........... | H01L 21/76897 |
| | | | | 257/774 |
| 2017/0338115 A1* | 11/2017 | Yen | ................... | H01L 21/76802 |
| 2017/0358492 A1* | 12/2017 | Burns | ............... | H01L 21/31144 |
| 2018/0204763 A1* | 7/2018 | Wallace | ........... | H01L 21/76816 |
| 2018/0233404 A1* | 8/2018 | Shu | .................. | H01L 21/76802 |
| 2019/0100430 A1* | 4/2019 | Chang | ................ | B81C 1/00031 |

* cited by examiner

SEMICONDUCTOR DEVICES AND FABRICATION METHODS THEREOF

CROSS-REFERENCE TO RELATED APPLICATIONS

This application claims the priority of Chinese Patent Application No. CN201910156243.7, filed on Mar. 1, 2019, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

In the process of fabricating semiconductor devices, a photolithography process is usually adopted to transfer the pattern from a mask to a substrate. The photolithography process includes: providing a substrate; forming a photoresist layer on the substrate; exposing and developing the photoresist layer to form a patterned photoresist layer, such that the pattern on the mask is transferred to the photoresist layer; etching the substrate using the patterned photoresist layer as a mask, such that the pattern on the photoresist layer is transferred to the substrate; and removing the photoresist layer.

With the size of semiconductor device continuously becoming smaller, the critical photolithography dimension gradually approaches or even exceeds the physical limits of the photolithography process, which leads to more serious challenges to the photolithography technique. A dual reconstruction technique is adopted in order to overcome these challenges. The basic idea of the dual reconstruction technique is to form the final target pattern through a double-patterning process, such that the photolithography limits for a single-patterning process may be overcome. That is, a critical dimension that cannot be realized by a single-patterning process may be achieved through a double-patterning process.

However, the performance of semiconductor devices fabricated based on existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a to-be-etched layer, including a plurality of first regions and a plurality of second regions arranged alternately along a first direction. For a second region of the plurality of second regions adjacent to a first region of the plurality of first regions, the first region and the second region adjoin each other. The method also includes forming a first mask layer on the to-be-etched layer in both the plurality of first regions and the plurality of second regions; and forming a top mask layer on the first mask layer that is on the first region of the to-be-etched layer. The projection pattern of the top mask layer on the top surface of the first mask layer divides the first mask layer on the first region into portions arranged in a second direction perpendicular to the first direction, and the top mask layer extends to adjacent second regions along the first direction. The method further includes removing a portion of the first mask layer formed on the first region on both sides of the top mask layer to form a first trench in the first mask layer on the first region. The first mask layer formed on the first region and located under the top mask layer forms a separation mask layer, and the separation mask layer divides the first trench into portions arranged in the second direction.

Another aspect of the present disclosure provides a semiconductor device. The semiconductor device includes a to-be-etched layer, including a plurality of first regions and a plurality of second regions arranged alternately along a first direction. For a first region of the plurality of first regions adjacent to a second region of the plurality of second regions, the first region and the second region adjoin each other. The semiconductor device also includes a first mask layer, formed on the to-be-etched layer and implanted with doping ions; a plurality of first trenches, formed in the first mask layer of the plurality of first regions. Each first trench of the plurality of first trenches is divided into portions arranged in a second direction by a separation mask layer. The second direction is perpendicular to the first direction. The semiconductor device further includes a plurality of second trenches, formed in the first mask layer of the plurality of second regions. Each second trench of the plurality of second trenches is divided into portions arranged in the second direction by a separation filling layer. The semiconductor device also includes a sidewall spacing layer serving as the sidewalls of each first trench of the plurality of first trenches.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In current technology, the performance of semiconductor devices may still need to be improved. FIGS. 1-6 illustrate schematic views of semiconductor structures at certain stages of a fabrication process of a semiconductor device.

Figure 1:
FIGS. 1-6 illustrate schematic views of semiconductor structures at certain stages of a fabrication process of a semiconductor device.

Referring to FIG. 1, a to-be-etched layer 100 is provided. The to-be-etched layer 100 includes a plurality of discrete first regions A01 and a plurality of discrete second regions A02. The plurality of first regions A01 and the plurality of second regions A02 are arranged alternately along a first direction X. For a first region A01 adjacent to a second region A02, the first region A01 and the second region A02 adjoin each other, e.g., the first region A01 and the second region A02 share an edge. Each second region A02 includes a trench region.

Figure 2:
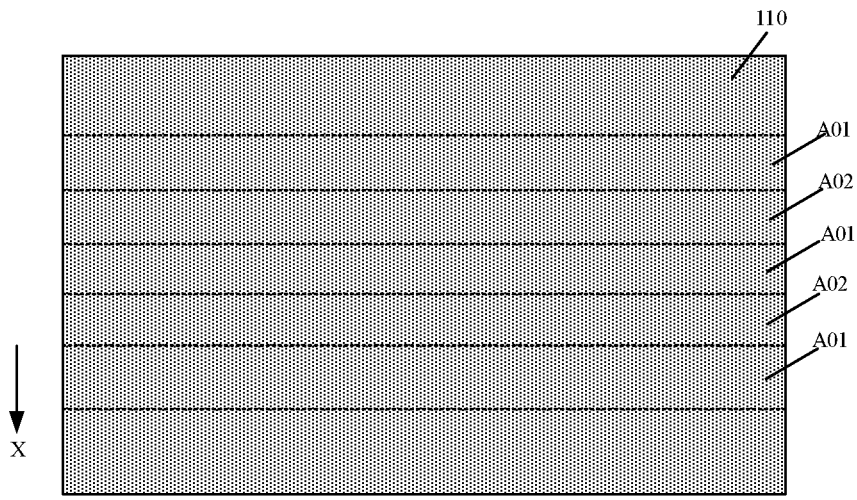

Referring to FIG. 2, a first mask layer 110 is formed on the plurality of first regions A01 and the plurality of second regions A02 of the to-be-etched layer 100.

Figure 3:
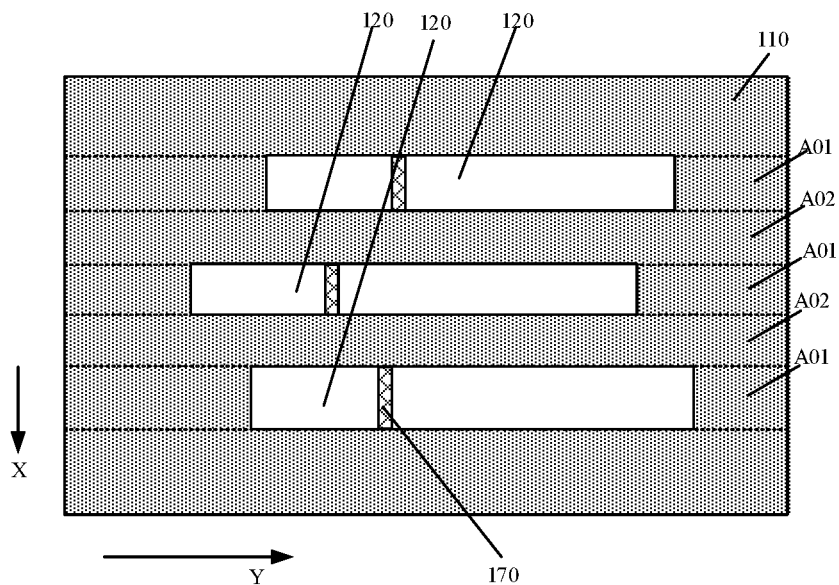

Referring to FIG. 3, a first trench 120 is formed in the first mask layer 110 on the first region A01; and a first separation layer 170 is formed in the first trench 120. The first separation layer 170 divides the first trench 120 into portions arranged in a second direction Y perpendicular to the first direction X.

Figure 4:
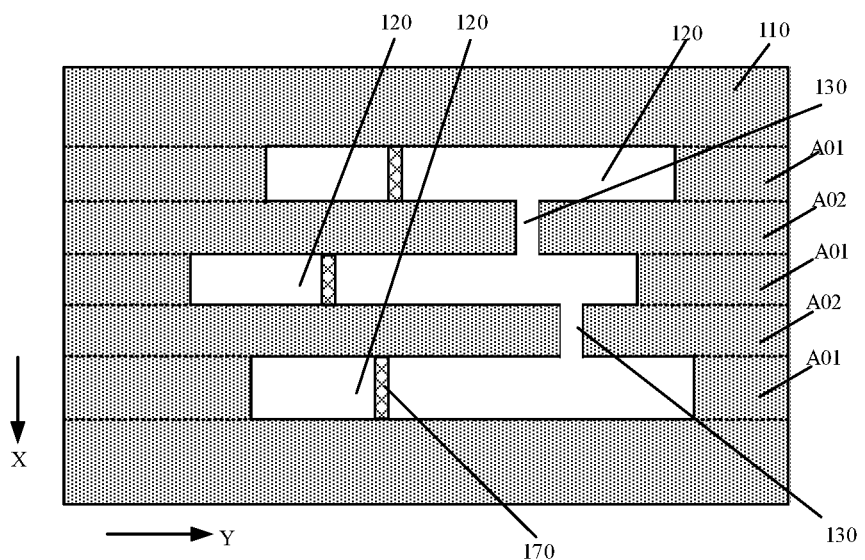

Referring to FIG. 4, after forming the first trench 120 and the first separation layer 170, a separation trench 130 is formed in the first mask layer 110 on the second region A02 of the to-be-etched layer 200. The separation trench 130 divides the first mask layer 110 of the trench region into portions arranged in the second direction Y.

Figure 5:
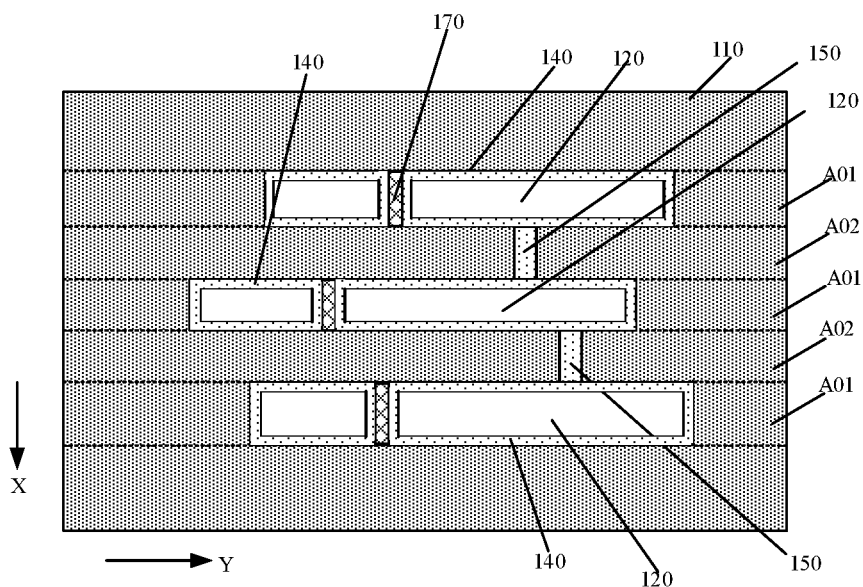

Referring to FIG. 5, after forming the separation trench 130, a sidewall spacing layer 140 is formed on the sidewall surface of the first trench 120. During the process of forming the sidewall spacing layer 140, a second separation layer 150 is formed in the separation trench 130.

Figure 6:
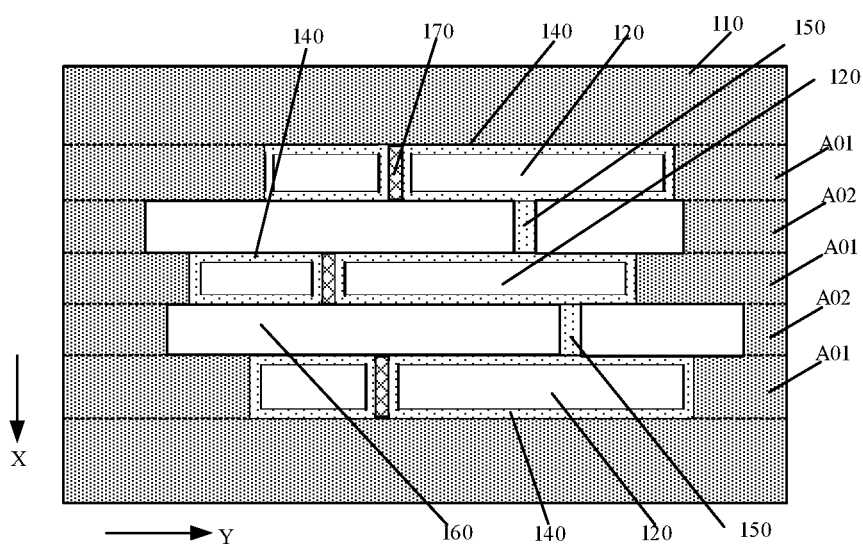

Referring to FIG. 6, after forming the second separation layer 150 and the sidewall spacing layer 140, the portion of the first mask layer 110 formed in the trench region on both sides of the second separation layer 150 is removed through etching to form a second trench 160. The second separation layer 150 divides the second trench 160 into portions arranged in the second direction Y.

The method for forming the first separation layer 170 includes the following steps. A blocking layer is formed in the first trench 120 and also on the first mask layer 110. A blocking-layer opening is formed in the blocking layer. The blocking-layer opening is located on a portion of the first trench 120 and extends to expose a portion of the first mask layer 110 on the second region along the first direction. The blocking-layer opening and the first trench 120 are connected to each other. A first separation film is formed in the blocking-layer opening and also in the first trench 120 exposed by the blocking-layer opening. The portion of the first separation film formed above the top surface of the first mask layer is removed to form the first separation layer 170.

The position of the first separation layer is defined by the overlapping region of the blocking-layer opening and the first trench 120, and thus the size of the first separation layer 170 can be made small in both the first direction X and the second direction Y. The blocking-layer opening extends along the first direction to expose a portion of the first mask layer 110 formed in the second region A02, the size of the blocking-layer opening in the first direction X may be large. Therefore, the formation process of the blocking layer may be less difficult, and thus the formation process of the first separation layer 170 may also be less difficult.

However, because the first separation layer 170 is formed after forming the first trench 120, the bonding strength between the first separation layer and the first mask layer as well as the bonding strength between the first separation layer and the material layer located under the first separation layer may not be desired. Therefore, the first separation layer 170 may easily collapse in a subsequent process.

The present disclosure provides a method for forming a semiconductor device. According to the formation method, a top mask layer is formed on the first mask layer that is on the first region of the to-be-etched layer, and the projection pattern of the top mask layer on the surface of the first mask layer divides the first mask layer on the first region into portions arranged in the second direction. The top mask layer also extends to the second region along the first direction that is perpendicular to the second direction. Further, a portion of the first mask layer on the first region that is located on both sides of the top mask layer is removed through an etching process using the top mask layer as an etch mask. As such a first trench is formed in the first mask layer on the first region, and the portion of the first mask layer on the first region and located under the top mask layer forms a separation mask layer. The separation mask layer divides the first trench into portions arranged in the second direction. According to the disclosed fabrication method, the performance of the fabricated semiconductor device may be improved.

Figure 24:
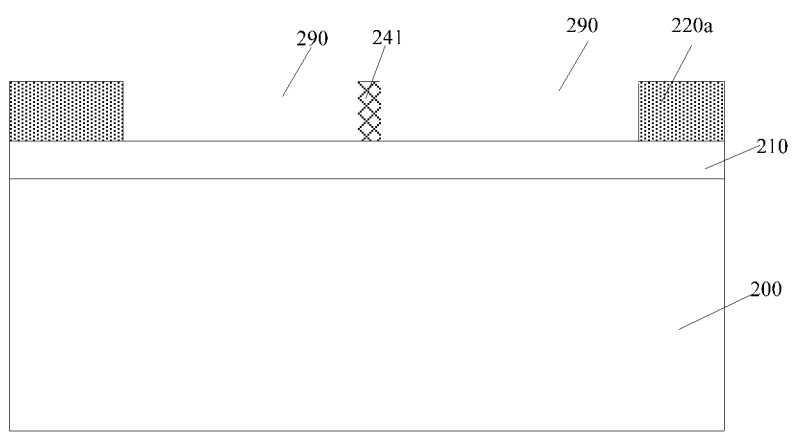
Figure 25:
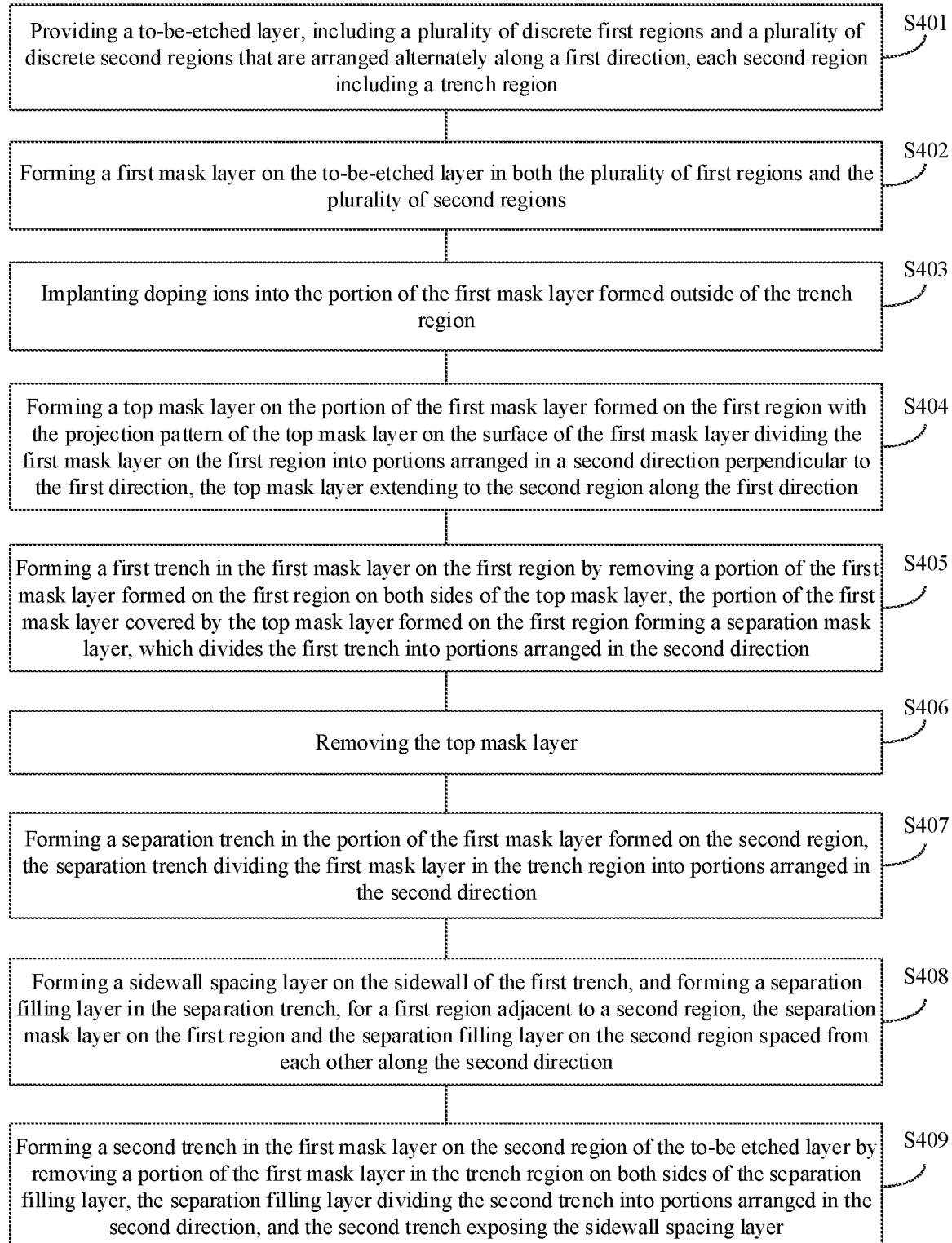
FIG. 25 illustrates a flowchart of an exemplary method for fabricating a semiconductor device consistent with various embodiments of the present disclosure.

FIG. 25 illustrates a flowchart of an exemplary method for fabricating a semiconductor device consistent with various embodiments of the present disclosure. FIGS. 7-24 illustrate schematic views of semiconductor structures at certain stages of the exemplary method.

Figure 7:
FIGS. 7-24 illustrate schematic views of semiconductor structures at certain stages of an exemplary method for fabricating a semiconductor device consistent with some embodiments of the present disclosure.

Referring to FIG. 25, at the beginning of the fabrication process, a to-be-etched layer may be provided, the to-be-etched layer may include a plurality of discrete first regions and a plurality of discrete second regions that are arranged alternately along a first direction, and the plurality of second regions may include a plurality trench regions (S401). FIG. 7 illustrates a schematic top view of a semiconductor structure consistent with various embodiments of the present disclosure.

Referring to FIG. 7, a to-be-etched layer 200 may be provided. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other.

In one embodiment, the plurality of first regions A1 may be arranged along the first direction X, and the plurality of second regions A2 may also be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2.

Further, the plurality of second regions A2 may include a plurality of trench regions. That is, in the plurality of second regions A2, the to-be-etched layer 200 includes a plurality of trench regions. The plurality of trench regions may be used to define the position of a plurality of second trenches that may be formed in a subsequent process. Each trench region may adjoin the adjacent first regions, e.g., a trench region may share an edge with each first region A1 adjacent to the trench region. In addition, the trench region may be located on a side of the adjacent first region A1 along the first direction X, e.g. the edge shared by the trench region and the first region A1 may be perpendicular to the first direction X.

In some embodiments, the total number of the first regions may equal to the total number of the second regions.

In one embodiment, the to-be-etched layer 200 may be made of a material including silicon oxide or a low-k dielectric material (e.g., a material with a relative dielectric constant k smaller than or equal to 3.9).

Figure 8:
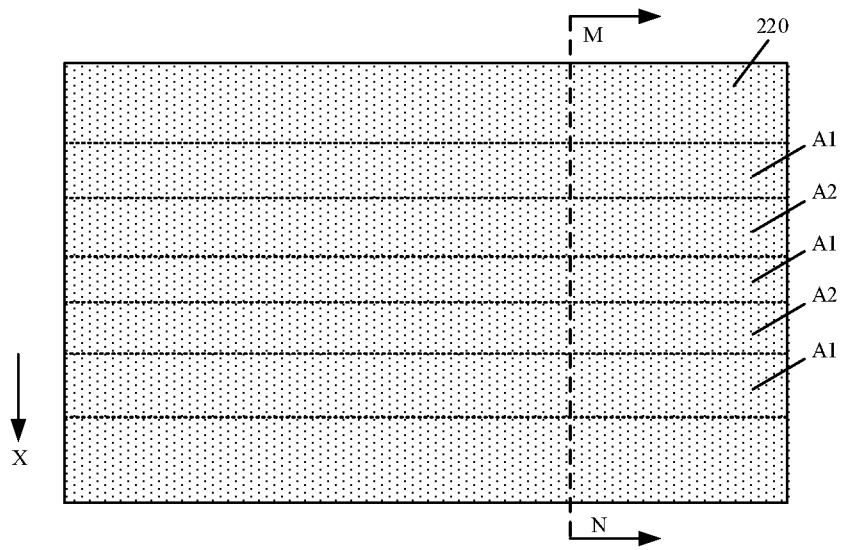
Figure 9:
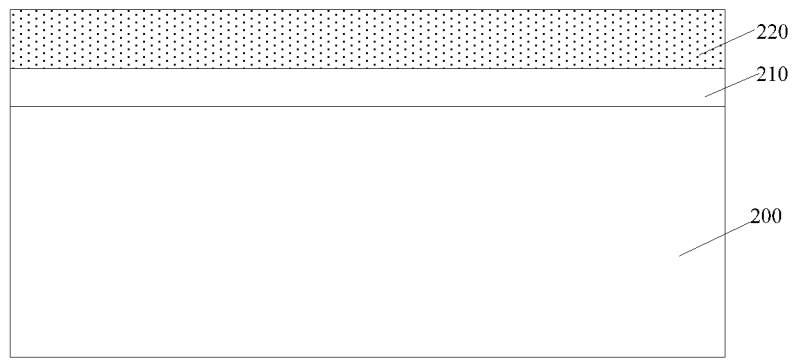

Further, returning to FIG. 25, a first mask layer may be formed on the to-be-etched layer in both the plurality of first regions and the plurality of second regions (S402). FIGS. 8-9 illustrate schematic views of a semiconductor structure consistent with various embodiments of the present disclosure. For example, FIG. 8 shows the semiconductor structure from a view direction consistent with that in FIG. 7, that is, FIG. 8 illustrates a schematic top view of the semiconductor structure; and FIG. 9 illustrates a schematic cross-sectional view of the semiconductor structure shown in FIG. 8 in an M-N direction.

Referring to FIGS. 8-9, a first mask layer 220 may be formed on the to-be-etched layer 200 in both the plurality of first regions A1 and the plurality of second regions A2. In one embodiment, the first mask layer 220 may be made of a material including amorphous silicon.

In some embodiments, prior to forming the first mask layer 220, the method may further include forming a first adhesion layer (not shown) on the to-be-etched layer 200; forming a bottom hard mask layer 210 on the first adhesion layer; and forming a second adhesion layer (not shown) on the bottom hard mask layer 210. Therefore, the first mask layer 220 may be formed on the second adhesion layer. In one embodiment, the bottom hard mask layer 210 may be made of a material including titanium nitride.

The material used for forming the first adhesion layer may include SiOC, and the material used for forming the second adhesion layer may include SiOC.

In one embodiment, the first adhesion layer may be used to improve the adhesion between the bottom hard mask layer 210 and the to-be-etched layer 200, such that the bonding between the bottom hard mask layer 210 and the to-be-etched layer 200 may be stronger. The second adhesion layer may be used to improve the adhesion between the first mask layer 220 and the bottom hard mask layer 210, such that the bonding between the first mask layer 220 and the bottom hard mask layer 210 may be stronger.

Further, the function of the bottom hard mask layer 210 may also include the following aspects. The bottom hard mask layer 210 may be used as an etch stop layer, e.g., the bottom hard mask layer 210 may be used as a stop layer during a subsequently performed planarization process on a conductive film. The bottom hard mask layer 210 may be made of a hard mask material, such that during subsequent formation of a plurality of first target trenches and a plurality of second target trenches, the etching loss of the bottom hard mask layer 210 may be limited. Therefore, during the process of transferring the pattern in the bottom hard mask layer 210 to the to-be-etched layer 200, the pattern transfer may demonstrate high stability.

In one embodiment, the bottom hard mask layer 210 and the first mask layer 220 may be made of different materials. In other embodiments, the fabrication method may not include forming the bottom hard mask layer, the first adhesion layer, and the second adhesion layer.

According to the present disclosure, the fabrication method may further include forming a top mask layer on the first mask layer 220 that is on the first region A1 of the to-be-etched layer 200. The projection pattern of the top mask layer on the surface of the first mask layer 220 may divide the first mask layer 220 on the first region A1 into portions arranged in a second direction Y. The top mask layer may also extend to the second region A2 along a first direction X perpendicular to the second direction Y.

In one embodiment, prior to forming the top mask layer, the method may further include implanting doping ions into the first mask layer 220 in a region outside of the plurality of trench regions. The doping ions may be implanted into the portion of the first mask layer 220 formed on the first regions A1, and also into the portion of the first mask layer 220 formed in the second regions A2 outside of the trench regions.

Figure 10:
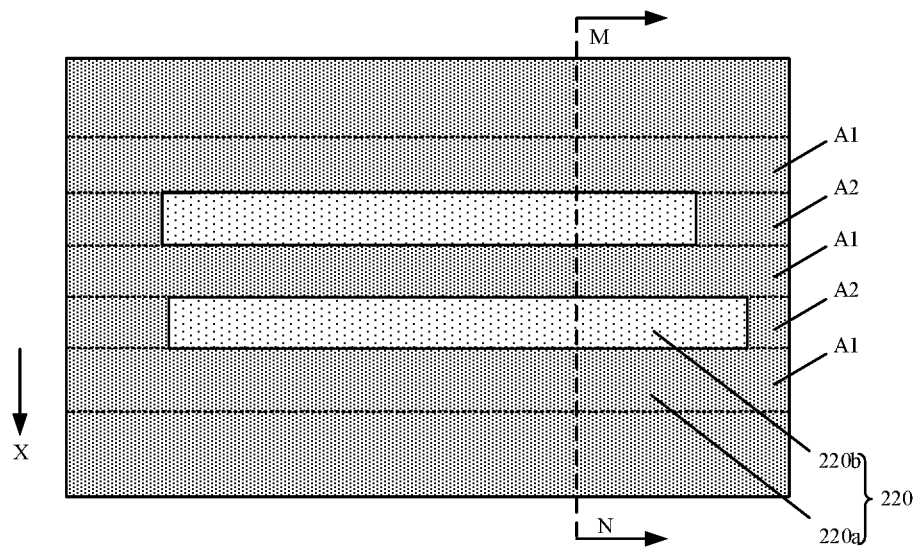
Figure 11:
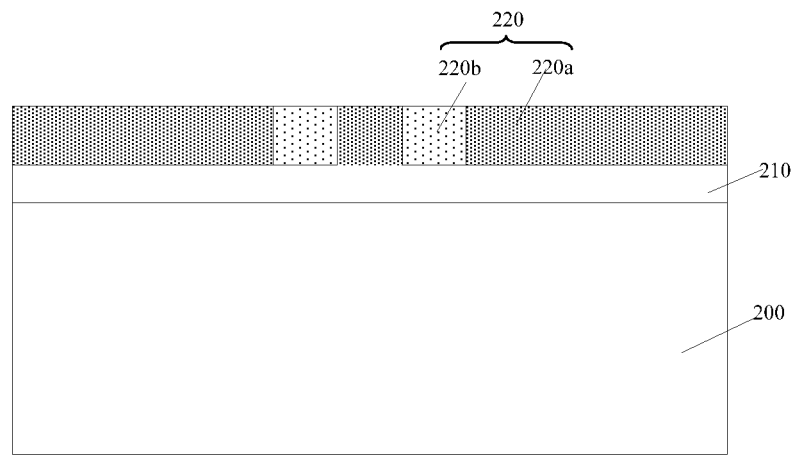

For example, returning to FIG. 25, doping ions may be implanted into the portion of the first mask layer formed outside of the plurality of trench regions (S403). FIGS. 10-11 illustrate schematic views of a semiconductor structure consistent with various embodiments of the present disclosure. For example, FIG. 10 shows the semiconductor structure from a view direction consistent with that in FIG. 8, and FIG. 11 shows the semiconductor structure from a view direction consistent with that in FIG. 9. That is, FIG. 11 illustrates a schematic cross-sectional view of the semiconductor structure shown in FIG. 10 in an M-N direction.

Referring to FIGS. 10-11, doping ions may be implanted into the portion of the first mask layer 220 formed outside of the plurality of trench regions. The doping ions may be implanted into the portion of the first mask layer 220 formed on the first regions A1, and also into the portion of the first mask layer 220 formed in the second regions A2 outside of the trench regions.

In one embodiment, the process of implanting doping ions into the portion of the first mask layer 220 formed outside of the plurality of trench regions may include the following exemplary steps. A first planarization layer may be formed on the first mask layer 220, a first bottom anti-reflective layer may be formed on the first planarization layer, and a first photoresist layer (not shown) may be formed and patterned on the first bottom anti-reflective layer. The first photoresist layer may cover the portion of the first bottom anti-reflective layer that is formed in the plurality of trench regions. The first photoresist layer may expose the portion of the first bottom anti-reflective layer formed in the plurality of first regions A1 and may also expose the portion of the first bottom anti-reflective layer formed in the plurality of second regions A2 and surrounding the plurality of trench regions. The first bottom anti-reflective layer and the first planarization layer may be etched using the first photoresist layer as an etch mask until the top surface of the first mask layer 220 is exposed. After etching the first bottom anti-reflective layer and the first planarization layer using the first photoresist layer as the etch mask to expose the top surface of the first mask layer 220, doping ions may be implanted into the portion of the first mask layer 220 that is formed outside of the plurality of trench regions using the first photoresist layer as a mask. After implanting doping ions into the portion of the first mask layer 220 that is formed outside of the plurality of trench regions using the first photoresist layer as the mask, the first planarization layer, the first bottom anti-reflective layer, and the first photoresist layer may be removed.

In one embodiment, after implanting doping ions into the portion of the first mask layer 220 formed outside of the plurality of trench regions, the first mask layer 220 may be divided into an ion-doped region 220a and an undoped region 220b.

In one embodiment, the first photoresist layer may expose the portion of the first mask layer 220 formed in the plurality of first regions A1. In other embodiments, the first photoresist layer may partially cover the portion of the first mask layer formed in the plurality of first regions.

In one embodiment, the doping ions may include boron ions and/or arsenic ions.

In the process of implanting the doping ions into the portion of the first mask layer 220 that is formed outside of the plurality of trench regions, due to the blocking of the first mask layer 220 and also because a plurality of first trenches and a plurality of second trenches have not been formed in the first mask layer 220 yet, the doping ions may be well prevented from being implanted into the material layer at the bottom of the first mask layer 220.

In one embodiment, in the process of implanting the doping ions into the portion of the first mask layer 220 formed outside of the plurality of trench regions, the surface of the first mask layer 220 may be flat, and thus the first planarization layer, the first bottom anti-reflective layer, and the first photoresist layer may all formed on the desired flat surface of the first mask layer 220, which may be conducive to the exposure process for patterning the first photoresist layer.

Figure 12:
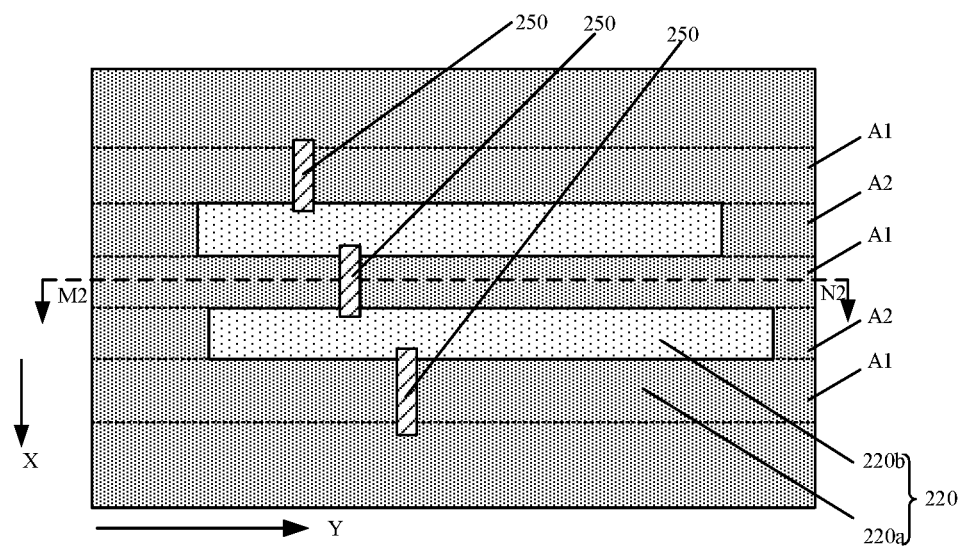
Figure 13:
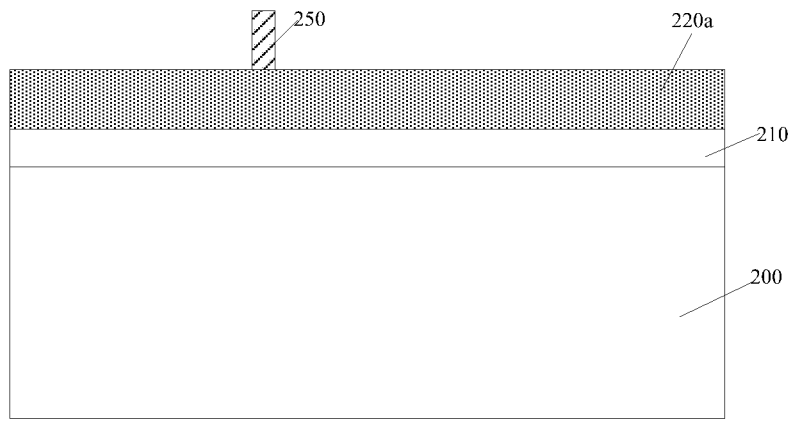

Further, returning to FIG. 25, a top mask layer may be formed on the portion of the first mask layer formed on the first region, the projection pattern of the top mask layer on the surface of the first mask layer may divide the first mask layer on the first region into portions arranged in a second direction perpendicular to the first direction, the top mask layer may also extends to the second region along the first direction (S404). FIGS. 12-13 illustrate schematic views of a semiconductor structure consistent with various embodiments of the present disclosure. For example, FIG. 12 shows the semiconductor structure from a view direction consistent with that in FIG. 10, and FIG. 13 illustrates a schematic cross-sectional view of the semiconductor structure shown in FIG. 12 in an M2-N2 direction.

Referring to FIGS. 12-13, a top mask layer 250 may be formed on the portion of the first mask layer 220 that is formed in the plurality of first regions A1. The projection pattern of the top mask layer 250 on the surface of the first mask layer 220 may divide the first mask layer 220 on the first region A1 into portions arranged in a second direction Y perpendicular to the first direction X. The top mask layer 250 may also extend to the second region A2 along the first direction X.

In one embodiment, the top mask layer 250 may be made of a material including $SiO_2$, SiN, $TiO_2$, TiN, AlN, $Al_2O_3$, etc. In addition, the material of the top mask layer 250 may be different from the material of the first mask layer 220.

In one embodiment, the width of the top mask layer 250 in the second direction Y may be in a range of approximately 10 nm to 40 nm. The extension direction (e.g. the length direction) of the top mask layer 250 may be parallel to the first direction X.

In one embodiment, the top mask layer 250 may also extend along the first direction X to cover a portion of the first mask layer 220 formed in the second region A2, such that the size of the top mask layer 250 in the first direction X may be large. Because the size of the top mask layer 250 may only need to be limited in the second direction Y, the process difficulty for forming the top mask layer 250 may be reduced.

In one embodiment, the process of forming the top mask layer 250 may include the following exemplary steps. A blocking layer (not shown) may be formed on the first mask layer 220. A blocking-layer opening may be formed in the blocking layer, and the blocking-layer opening may be located on a portion of the first mask layer 220 formed on the first region A1, and may also extend along the first direction to expose a portion of the first mask layer 220 formed in the adjacent second regions A2. The blocking-layer opening formed in each first region A1 may divide the first mask layer 220 formed on the first region A1 into portions arranged in the second direction Y. The top mask layer 250 may then be formed in the blocking-layer opening. After forming the top mask layer 250 in the blocking-layer opening, the blocking layer may be removed.

In one embodiment, the extending direction (e.g., the length direction) of each blocking-layer opening may be parallel to the first direction X, and the blocking-layer opening may define the position of the top mask layer 250. The blocking layer may be made of a material including a carbon-containing organic polymer.

In one embodiment, the process of forming the blocking layer may include the following exemplary steps. A second planarization layer may be formed on the first mask layer 220, a second bottom anti-reflective layer may be formed on the second planarization layer, and a second photoresist layer may be formed and patterned on the second bottom anti-reflective layer. A plurality of second lithography openings may be formed in the second photoresist layer. The plurality of second lithography openings may define the positions of the plurality of blocking-layer opening. The second bottom anti-reflective layer and the second planarization layer at the bottom of each second lithography opening may be etched using the second photoresist layer as an etch mask until the top surface of the first mask layer 220 is exposed. As such, the remaining portion of the second planarization layer may form the blocking layer. Further, the second bottom anti-reflective layer and the second photoresist layer may be removed.

In one embodiment, the width of the blocking-layer opening in the second direction Y may be used to define the size of the top mask layer 250 in the second direction Y. Because the size of the top mask layer 250 in the second direction Y may need to be small, the width of the corresponding blocking-layer opening may also need to be small. For example, in one embodiment, the width of the blocking-layer opening in the second direction Y may be in a range of approximately 10 nm to 40 nm, e.g., 20 nm, 30 nm, 40 nm, etc.

Because the blocking-layer opening also extends to the second region A2 along the first direction X, the size of the blocking-layer opening in the first direction X may be large. Therefore, the size of the blocking-layer opening may only need to be limited in the second direction Y, while the size of the blocking-layer opening in the first direction X may not need to be defined small.

Because the second lithography opening defines the position of the blocking-layer opening, the size of the second lithography opening in the first direction X may correspond to the size of the blocking-layer opening in the first direction X, and the size of the second lithography opening in the second direction Y may correspond to the size of the blocking-layer opening in the second direction Y. Therefore, the size of the second lithography opening may only need to be limited in the second direction Y, while the size of the second lithography opening in the first direction X may not need to be defined small. As such, the challenge on the photolithography process may be lowered, and the process difficulty may be reduced.

In one embodiment, the size of the second lithography opening in the second direction Y may be in a range of approximately 10 nm to 40 nm, and the size of the second lithography opening in the first direction X may be in a range of approximately 65 nm to 1000 nm, e.g. 80 nm, 100 nm, 200 nm, etc.

Figure 14:
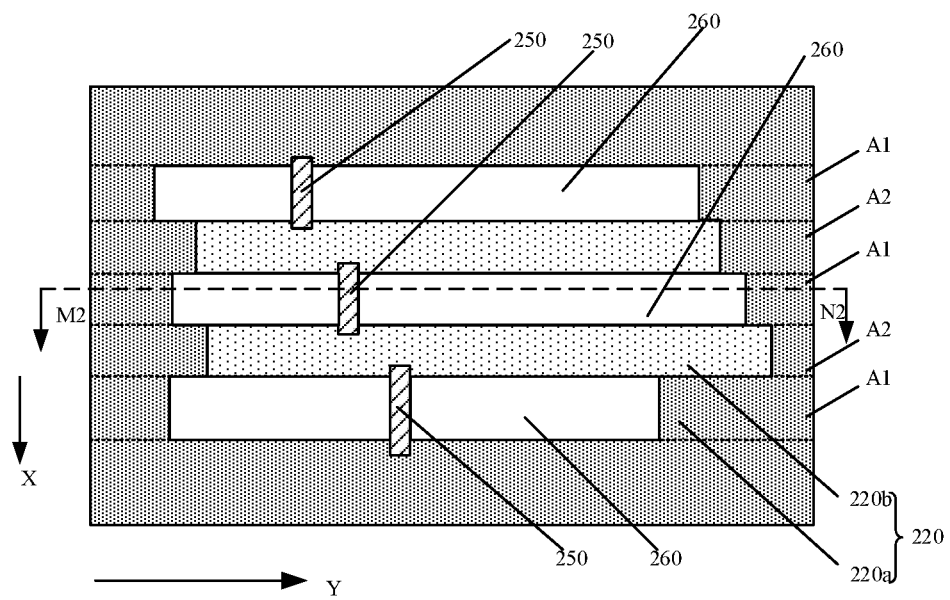
Figure 15:
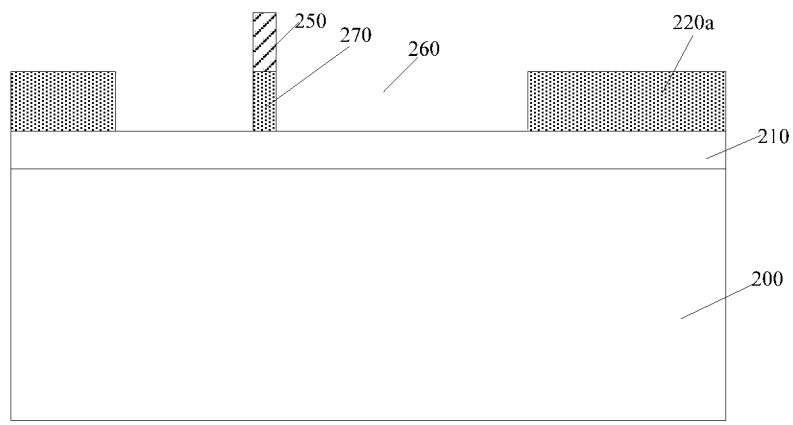

Further, returning to FIG. 25, a first trench may be formed in the first mask layer on the first region of the to-be-etched layer by removing a portion of the first mask layer on the first region on both sides of the top mask layer using the top mask layer as an etch mask, and during the formation of the first trench, the portion of the first mask layer covered by the top mask layer on the first region may form a separation mask layer, which divides the first trench into portions arranged in the second direction (S405). FIGS. 14-15 illustrate schematic views of a semiconductor structure consistent with various embodiments of the present disclosure. For example, FIG. 14 shows the semiconductor structure from a view direction consistent with that in FIG. 12, and FIG. 15 illustrates a schematic cross-sectional view of the semiconductor structure shown in FIG. 14 in an M2-N2 direction.

Referring to FIGS. 14-15, a portion of the first mask layer 220 on the first region A1 located on both sides of the top mask layer 250 may be partially removed through an etching process using the top mask layer 250 as an etch mask to form a first trench 260 in the first mask layer 220 on the first region A1. During the formation of the first trench 260, the portion of the first mask layer 220 covered by the top mask layer 250 on the first region A1 may form a separation mask layer 270. The separation mask layer 270 may divide a corresponding first trench 260 into portions arranged in the second direction Y.

In one embodiment, the first trench 260 may adjoin the adjacent trench regions. In one embodiment, the process of forming the plurality of first trenches 260 may include a dry etching process, for example, an anisotropic dry etching process, etc.

In one embodiment, the extending direction (e.g., the length direction) of each first trench 260 may be parallel to the second direction Y, and the second direction Y may be perpendicular to the first direction X.

In one embodiment, the width of the first trench 260 in the first direction X may be in a range of approximately 10 nm to 60 nm. Further, along the first direction X, the distance between two adjacent first trenches 260 may be in a range of approximately 10 nm to 60 nm.

It should be noted that in one embodiment, the plurality of first trenches 260 is formed in the first mask layer 220 on the first regions A1 after implanting the doping ions into the portion of the first mask layer 220 formed outside of the plurality of trench regions. Therefore, during the dry etching process for forming the plurality of first trenches 260, the etching rate of the portion of the first mask layer 220 that is implanted with the doping ions may need to be similar to the etching rate of the portion of the first mask layer 220 that is not implanted with the doping ions. That is, the doping ions implanted into the first mask layer 220 may have a small or negligible effect on the performance of dry etching the first mask layer 220. As such, the difficulty of the etching process for forming the plurality of first trenches may be reduced.

Because the size of the separation mask layer 270 in the first direction X is defined by the width of the first trench 260 in the first direction X, and the width of the first trench 260 in the first direction X is formed small, the size of the separation mask layer 270 in the first direction X may also be small. In addition, because the size of the separation mask layer 270 in the second direction Y is defined by the size of the top mask layer 250 in the second direction Y, and the size of the top mask layer 250 in the second direction Y is formed small, the size of the separation mask layer 270 in the second direction Y may also be small. Therefore, the size of the separation mask layer 270 may be small in both the first direction X and the second direction Y.

In one embodiment, the size of the separation mask layer 270 in the first direction X may be in a range of approximately 10 nm to 60 nm, and the size of the separation mask layer 270 in the second direction Y may be in a range of approximately 10 nm to 40 nm.

In one embodiment, the top mask layer 250 may be used as a mask in the process of forming the plurality of first trenches 260. Therefore, in the process of etching the first mask layer 220 on the first region A1 to form the first trench 260, the portion of the first mask layer 220 on the first region A1 and located under the top mask layer 250 may be retained to form a separation mask layer 270, and the first trench 260 may be divided into portions arranged in the second direction Y by the separation mask layer 270. Because the separation mask layer 270 is formed by a portion of the first mask layer 220, the bonding strength between the separation mask layer 270 and the bottom material may be strong, and thus the separation mask layer 270 may not easily collapse. In addition, the bonding strength between the separation mask layer 270 and the portion of the first mask layer 220 surrounding the separation mask layer 270 may be strong.

Figure 16:
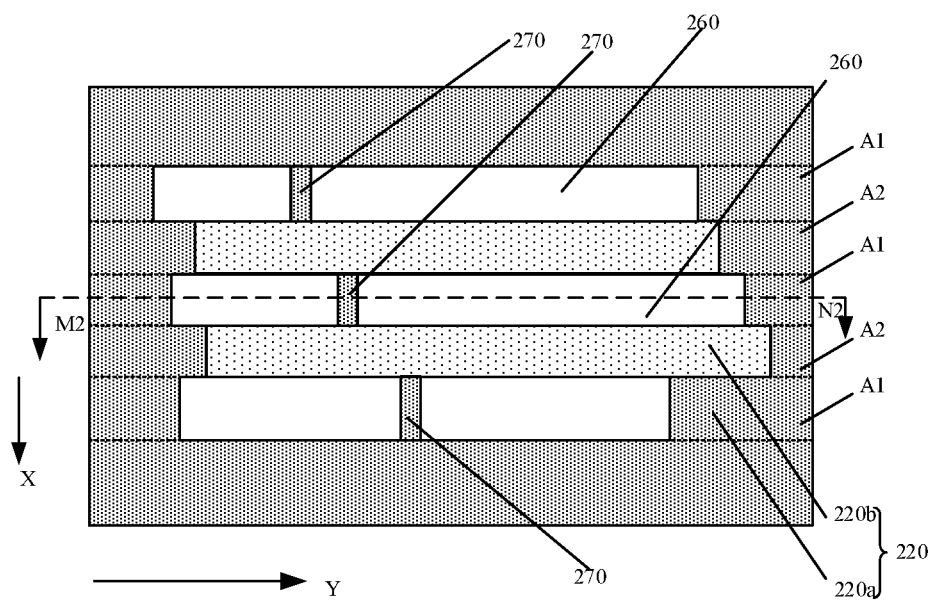
Figure 17:
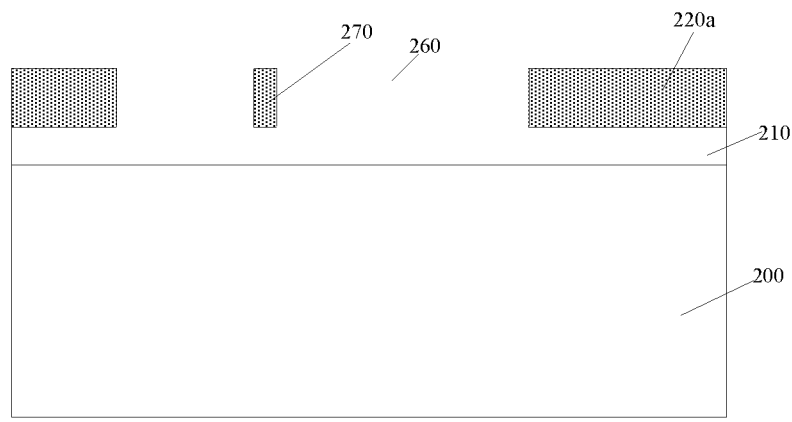

Further, returning to FIG. 25, the top mask layer may be removed (S406). FIGS. 16-17 illustrate schematic views of a semiconductor structure consistent with various embodiments of the present disclosure. For example, FIG. 16 shows the semiconductor structure from a view direction consistent with that in FIG. 14, FIG. 17 shows the semiconductor structure from a view direction consistent with that in FIG. 15, and FIG. 17 illustrates a schematic cross-sectional view of the semiconductor structure shown in FIG. 16 in an M2-N2 direction.

Referring to FIGS. 16-17, after partially removing the first mask layer 220 on the first regions A1 that is located on both sides of the top mask layer 250, the top mask layer 250 may be removed.

Figure 18:
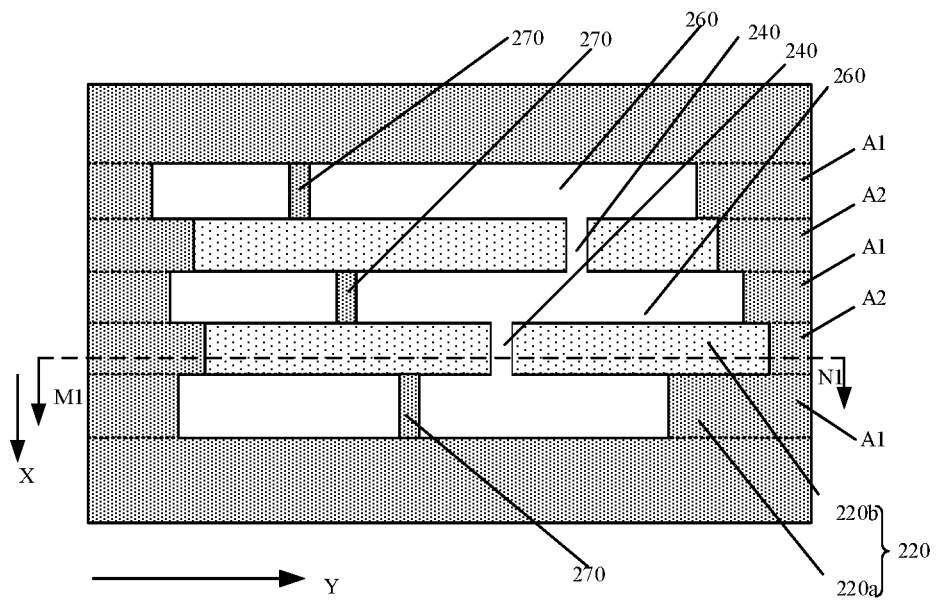
Figure 19:
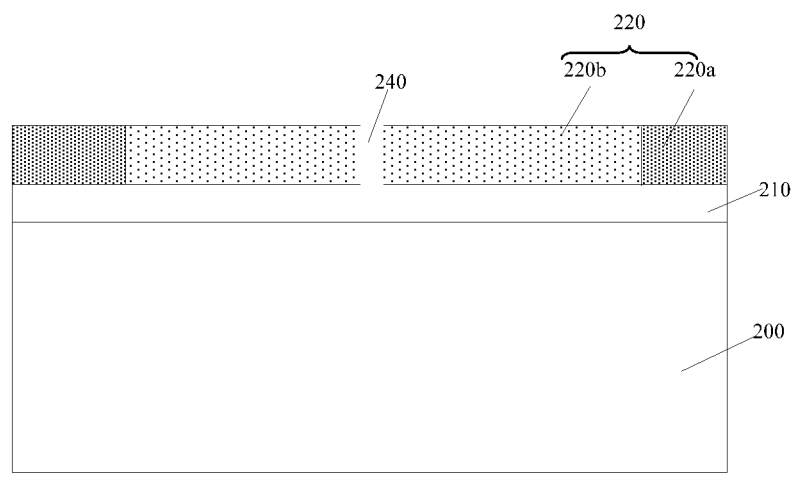

Further, returning to FIG. 25, a separation trench may be formed in the portion of the first mask layer on the second region of the to-be-etched layer, and the separation trench may divide the first mask layer of the trench region into portions arranged in the second direction (S407). FIGS. 18-19 illustrate schematic views of a semiconductor structure consistent with various embodiments of the present disclosure. For example, FIG. 18 shows the semiconductor structure from a view direction consistent with that in FIG. 16, and FIG. 19 illustrates a schematic cross-sectional view of the semiconductor structure shown in FIG. 18 in an M1-N1 direction.

Referring to FIGS. 18-19, a plurality of separation trenches 240 may be formed in the portion of the first mask layer 220 on the second regions A2, and each separation trench 240 may divide the first mask layer 220 of the trench region into portions arranged in the second direction Y perpendicular to the first direction X.

In one embodiment, the size of the separation trench 240 in the second direction may need to be small. For example, the size of the separation trench 240 in the second direction may be in a range of approximately 10 nm to 40 nm.

The plurality of separation trenches 240 may extend to the first region A1. In one embodiment, the plurality of separation trenches 240 may be connected to the plurality of first trenches 260. In other embodiments, the plurality of separation trenches and the plurality of first trenches may be separated from each other, and each separation trench may extend to the portion of the first mask layer on the first region. Alternatively, some separation trenches may be connected to the first trenches, and other separation trenches may extend into the first mask layer formed on the first regions. FIG. 18 merely illustrates a schematic view corresponding to a case where all the separation trenches 240 are connected to the first trenches 260.

In one embodiment, the process of forming the separation trench 240 may include the following exemplary steps. A third planarization layer may be formed on the first mask layer 220 and also in the first trench 260, a third bottom anti-reflective layer may be formed on the third planarization layer, and a third photoresist layer may be formed and patterned on the third bottom anti-reflective layer. A plurality of third lithography openings may be formed in the third photoresist layer. Each third lithography opening may be located on a portion of the trench region, and may also extend to the adjacent first region A1 along the first direction X. The third bottom anti-reflective layer and the third planarization layer at the bottom of each third lithography opening may be etched using the third photoresist layer as an etch mask until the top surface of the first mask layer 220 is exposed. Then, the portion of the first mask layer 220 exposed at the bottom of the third lithography opening may be etched using the third photoresist layer as an etch mask to form the separation trench 240 in the first mask layer 220. Further, the third planarization layer, the third bottom anti-reflective layer, and the third photoresist layer may be removed.

For a separation trench 240 that extends into the first mask layer 220 on the first region A1 and is also separated from the plurality of first trenches 260, the size of the separation trench 240 in the first direction X may be allowed to be made large, such that the size of the separation trench 240 in the first direction X may be large compared to the size in the second direction Y. Therefore, the size of the separation trench 240 may only need to be defined small in the second direction Y. As such, the process difficulty for forming the separation trench 240 may be reduced.

For a separation trench 240 that is connected to the first trenches 260 and located between two adjacent first trenches 260 in the first direction X, the third lithography opening corresponding to the separation trench 240 may also extend to the first trenches 260. Accordingly, the size of the third lithography opening in the first direction X may be large compared to the size in the second direction Y. Therefore, the size of the third lithography opening may only need to be defined small in the second direction Y. As such, the process difficulty for forming the third lithography opening may be reduced.

The size of the separation trench 240 in the second direction Y may be smaller than the size of the first trench 260 in the first direction X.

Figure 20:
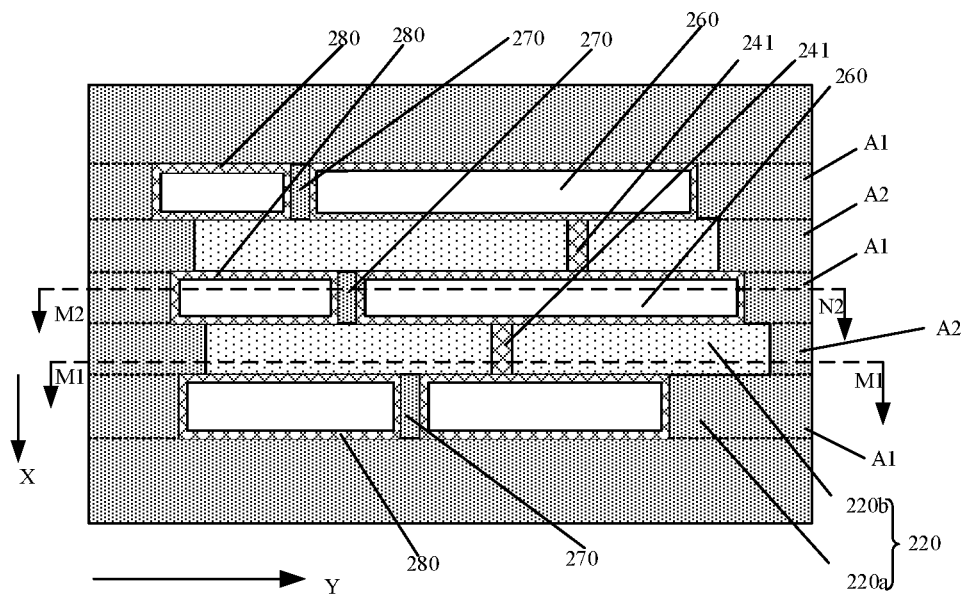
Figure 21:
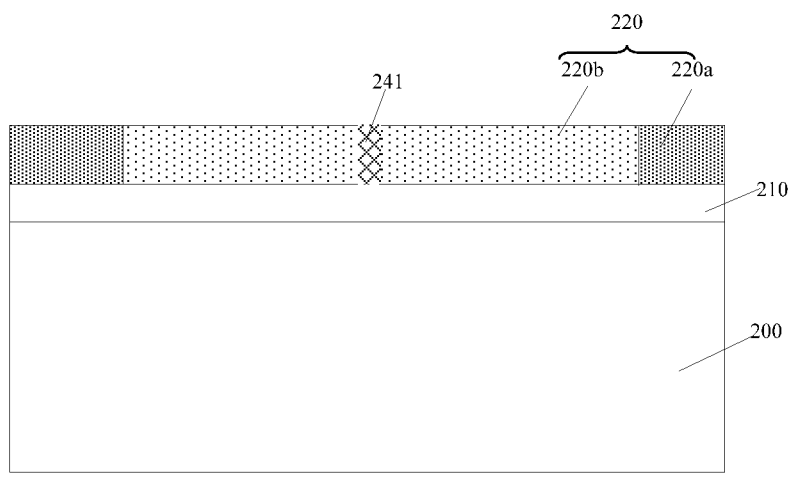
Figure 22:
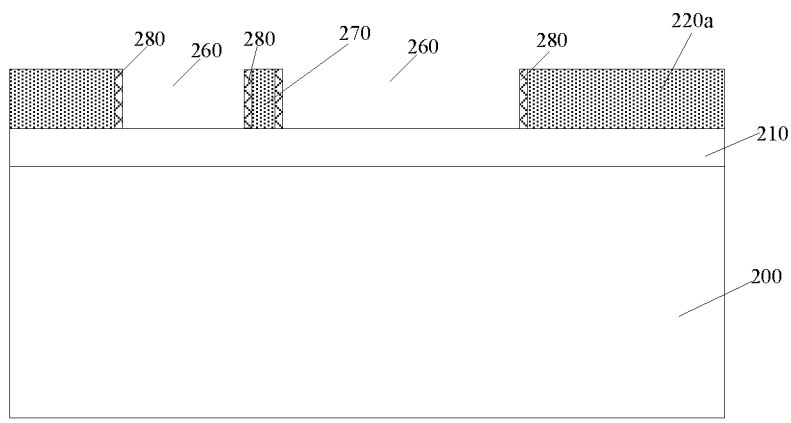

Further, returning to FIG. 25, after forming the separation trench, a sidewall spacing layer may be formed on the sidewall of the first trench; during the process of forming the sidewall spacing layer, a separation filling layer may be formed in the separation trench; and for a first region and a second region adjacent to each other, the separation mask layer on the first region and the separation filling layer in the second region may be spaced from each other along the second direction (S408). FIGS. 20-22 illustrate schematic views of a semiconductor structure consistent with various embodiments of the present disclosure. For example, FIG. 20 shows the semiconductor structure from a view direction consistent with that in FIG. 18, FIG. 21 shows the semiconductor structure from a view direction consistent with that in FIG. 19, and FIG. 21 illustrates a schematic cross-sectional view of the semiconductor structure shown in FIG. 20 in an M1-N1 direction, and FIG. 22 illustrates a schematic cross-sectional view of the semiconductor structure shown in FIG. 20 in an M2-N2 direction.

Referring to FIGS. 20-22, after forming the separation trench 240, a sidewall spacing layer 280 may be formed on the sidewall of the first trench 260. During the process of forming the sidewall spacing layer 280, a separation filling layer 241 may be formed in the separation trench 240. Moreover, for a first region A1 and a second region A2 adjacent to each other, the separation mask layer 270 on the first region A1 and the separation filling layer 241 in the second region A2 may be spaced from each other along the second direction Y. That is, the distance between the separation mask layer 270 on the first region A1 and the separation filling layer 241 in the second region A2 may be larger than zero.

In one embodiment the distance between the projection pattern of the separation filling layer 241 on the surface of the to-be-etched layer 200 and the projection pattern of the separation mask layer 270 on the surface of the to-be-etched layer 200 may be larger than zero.

In one embodiment, the sidewall spacing layer 280 may be made of a material including $SiO_2$, SiN, $TiO_2$, TiN, AlN, or $Al_2O_3$, and the separation filling layer 241 may be made of a material including $SiO_2$, SiN, $TiO_2$, TiN, AlN, or $Al_2O_3$. The thickness of the sidewall spacing layer 280 may be in a range of approximately 10 nm to 25 nm.

In one embodiment, the sidewall spacing layer 280 and the first mask layer 220 may be made of different materials. For example, the material of the sidewall spacing layer 280 may be different from the material of the undoped first mask layer 220.

In one embodiment, the size of the separation trench 240 in the second direction may be smaller than or equal to two times of the thickness of the sidewall spacing layer 280, and the size of the separation filling layer 241 in the second direction may be smaller than equal to two times of the thickness of the sidewall spacing layer 280.

In one embodiment, the size of the separation filling layer 241 in the second direction Y may be in a range of approximately 10 nm to 40 nm.

In one embodiment, the process of forming the separation filling layer 241 and the sidewall spacing layer 280 may include the following exemplary steps. A separation filling film may be formed on the sidewall and the bottom surfaces of the first trench 260, in the separation trench 240, and also on the first mask layer 220. The separation filling film may then be etched back until the top surface of the first mask layer 220 is exposed. As such, the separation filling layer 241 and the sidewall spacing layer 280 may be formed.

In one embodiment, forming the separation filling layer 241 and the sidewall spacing layer 280 in a same fabrication process may simplify the process steps.

In one embodiment, the separation filling layer 241 and the first mask layer 220 may be made of different materials, and the sidewall spacing layer 280 and the first mask layer 220 may also be made of different materials.

In one embodiment, the separation filling layer 241 and the sidewall spacing layer 280 may be made of a same material. In other embodiments, the separation filling layer 241 and the sidewall spacing layer 280 may be made of different materials.

It should be noted that even with the separation trench 240 and the first trench 260 connected to each other, during the process of forming the sidewall spacing layer 280, the sidewall spacing layer 280 may not be formed to fully fill the portion of the first trench 260 in the first direction X at the position where the separation trench 240 and the first trench 260 are connected to each other, and the first trench 260 may not be divided into portions in the second direction Y by the separation filling layer 241. For the separation trench 240 that is separated from the first trenches 260, the separation trench 240 may extend to the first region A1, and thus the separation filling layer 241 may also extend to the first region A1. As such, the first trench 260 may not be divided by the separation filling layer 241. Therefore, after forming the separation filling layer 241, the separation filling layer 241 may be able to completely divide the first mask layer 220 in the trench region but not divide the first trench 260. In a subsequent process of forming a second trench, because of the blocking of the separation filling layer 241, the second trench may be completely divided into portions in the second direction Y by the separation filling layer 241.

In one embodiment, the sidewall surfaces of the separation mask layer 270 that are perpendicular to the second direction Y may also be covered by the sidewall spacing layer 280. As such, the sidewall spacing layer 280 formed on the sidewall surfaces of the separation mask layer 270 may provide protection for the separation mask layer 270, and thus in the subsequent process of forming the plurality of second trenches, the separation mask layer 270 may not easily collapse.

Figure 23:
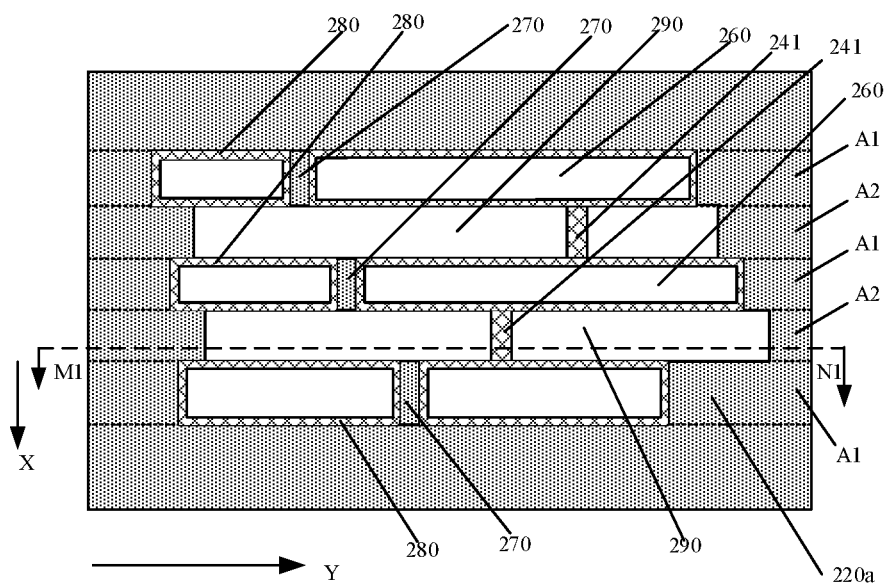

Further, returning to FIG. 25, a portion of the first mask layer formed in the trench region on both sides of the separation filling layer may be removed through etching to form a second trench in the first mask layer on the second region of the to-be-etched layer, the separation filling layer dividing the second trench into portions arranged in the second direction, and the second trench exposing the sidewall spacing layer (S409). FIGS. 23-24 illustrate schematic views of a semiconductor structure consistent with various embodiments of the present disclosure. For example, FIG. 23 shows the semiconductor structure from a view direction consistent with that in FIG. 20, FIG. 24 shows the semiconductor structure from a view direction consistent with that in FIG. 21, and FIG. 24 illustrates a schematic cross-sectional view of the semiconductor structure shown in FIG. 23 in an M1-N1 direction.

Referring to FIGS. 22-23, after forming the sidewall spacing layer 280 and the separation filling layer 241, a portion of the first mask layer 220 formed in the trench region on both sides of the separation filling layer 241 may be removed through etching to form a second trench 290 in the first mask layer 220 on the second region A2 of the to-be-etched layer 200. The separation filling layer 241 may divide the second trench 290 into portions arranged in the second direction Y, and the sidewall spacing layer 280 may be exposed in the second trench 290 and thus may serve as a portion of the sidewall of the second trench 290.

In one embodiment, the sidewall spacing layer 280 may be exposed in the second trench 290 and thus may serve as a portion of the sidewall of the second trench 290. Therefore, the second trench 290 and the adjacent first trench 260 may be separated by the sidewall spacing layer 280.

In one embodiment, the process for removing the portion of the first mask layer 220 formed in the trench region on both sides of the separation filling layer 241 may be a wet etching process.

During removing the portion of the first mask layer 220 formed in the trench region on both sides of the separation filling layer 241, the etching rate of the portion of the first mask layer 220 not implanted with the doping ions may be greater than the etching rate of the portion of the first mask layer 220 implanted with the doping ions.

In one embodiment, during removing the portion of the first mask layer 220 formed in the trench region on both sides of the separation filling layer 241, the etching rate of the undoped region 220b may be a first etching rate, the etching rate of the doped region 220a may be a second etching rate, and the ratio of the first etching rate to the second etching rate may be larger than or equal to approximately 100, e.g. 150.

In one embodiment, because the sidewall spacing layer 280 and the undoped region 220b are made of different materials, the process for removing the portion of the first mask layer 220 formed in the trench region on both sides of the separation filling layer 241 may be prevented from etching through the sidewall spacing layer 280 and causing penetration between the first trench and the adjacent second trench.

In one embodiment, the extending direction (e.g., the length direction) of the second trench 290 may be parallel to the second direction Y. The width of the second trench 290 in the first direction X may be in a range of approximately 10 nm to 60 nm.

In one embodiment, the fabrication method may also include etching the portion of the to-be-etched layer 200 at the bottom of the first trench 260 to form a first target trench in the to-be-etched layer 200; etching the portion of the to-be-etched layer 200 at the bottom of the second trench 290 to form a second target trench in the to-be-etched layer 200; forming a first conductive layer in the first target trench; and forming a second conductive layer in the second target trench.

In one embodiment, prior to etching the portion of the to-be-etched layer 200 at the bottom of the first trench 260 and the second trench 290, the fabrication method may also include etching the portion of the second adhesion layer, the bottom hard mask layer 210, and the first adhesion layer at the bottom of the first trench 260 to form a first hard mask trench in the bottom hard mask layer 210 at the bottom of the first trench 260; and etching the portion of the second adhesion layer, the bottom hard mask layer 210, and the first adhesion layer at the bottom of the second trench 290 to form a second hard mask trench in the bottom hard mask layer 210 at the bottom of the second trench 290.

In one embodiment, after etching the portion of the second adhesion layer, the bottom hard mask layer 210, and the first adhesion layer at the bottom of the first trench 260 and the portion of the second adhesion layer, the bottom hard mask layer 210, and the first adhesion layer at the bottom of the second trench 290, and prior to forming the first conductive layer and the second conductive layer, the first mask layer 220 and the second adhesion layer may be removed. After removing the first mask layer 220 and the second adhesion layer, the portion of the to-be-etch layer 200 at the bottom of the first hard mask trench may be etched to form a first target trench in the to-be-etched layer 200. The portion of the to-be-etch layer 200 at the bottom of the second hard mask trench may be etched to form a second target trench in the to-be-etched layer 200. After forming the first target trench and the second target trench, a conductive film layer may be formed in the first target trench and the second target trench and also on the bottom hard mask layer 210. The conductive film layer may be planarized until the top surface of the bottom hard mask layer 210 is exposed, such that a first conductive layer may be formed in the first target trench and a second conductive layer may be formed in the second target trench. Further, the bottom hard mask layer 210 and the first adhesion layer may be removed.

In one embodiment, the first conductive layer and the second conductive layer may be both made of a metal, e.g. copper, aluminum, etc.

Further, the present disclosure also provides a semiconductor device fabricated through the method described above. FIGS. 23-24 illustrate schematic views of an exemplary semiconductor device consistent with various embodiments of the present disclosure. For example, FIG. 23 illustrates a schematic top view of the semiconductor device and FIG. 24 illustrates a schematic cross-sectional view of the semiconductor device shown in FIG. 23 in the M1-N1 direction.

Referring to FIGS. 23-24, the semiconductor device may include a to-be-etched layer 200. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other.

In one embodiment, the plurality of first regions A1 may be arranged along the first direction X, and the plurality of second regions may be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2.

The semiconductor device may include a first mask layer (not labeled) formed on the to-be-etched layer 200, a plurality of first trenches 260 formed in the first mask layer on the first regions A1, and a plurality of second trenches 290 formed in the first mask layer on the second regions A2 of the to-be-etched layer 200. The first mask layer may be implanted with a plurality of doping ions, and thus the first mask layer may include an ion-doped region 220a. In one embodiment, the doping ions implanted into the ion-doped region 220a of the first mask layer may include boron ions and/or arsenic ions.

In some embodiments, the semiconductor device may also include a bottom hard mask layer 210 formed between the to-be-etched layer 200 and the first mask layer, a first adhesion layer formed between the bottom hard mask layer 210 and the to-be-etched layer 200, and a second adhesion layer formed between the bottom hard mask layer and the first mask layer.

In one embodiment, the first adhesion layer may be used to improve the adhesion between the bottom hard mask layer 210 and the to-be-etched layer 200, such that the bonding between the bottom hard mask layer 210 and the to-be-etched layer 200 may be stronger. The second adhesion layer may be used to improve the adhesion between the first mask layer and the bottom hard mask layer 210, such that the bonding between the first mask layer and the bottom hard mask layer 210 may be stronger.

When the bottom hard mask layer 210 is formed on the to-be-etched layer 200, the plurality of first trenches 260 and the plurality of second trenches 290 may expose the top surface of the bottom hard mask layer.

In one embodiment, each first trench 260 may be divided into portions arranged in a second direction Y by a separation mask layer 270, and each second trench 290 may be divided into portions arranged in the second direction Y by a separation filling layer 241. The second direction Y may be perpendicular to the first direction X.

In one embodiment, the semiconductor device may include a sidewall spacing layer 280 serving as the sidewalls of each first trench 260. The sidewall spacing layer 280 may also cover the sidewall surfaces of the separation mask layer 270. In one embodiment, each first trench 260 may be separated from an adjacent second trench 290 by a sidewall spacing layer 280.

In one embodiment, the size of the separation filling layer 241 in the first direction X may be in a range of approximately 10 nm to 60 nm, and the size of the separation filling layer 241 in the second direction Y may be in a range of approximately 10 nm to 40 nm.

In one embodiment, the width of the first trench 260 in the first direction X may be in a range of approximately 10 nm to 60 nm. Further, along the first direction X, the distance between two adjacent first trenches 260 may be in a range of approximately 10 nm to 60 nm.

In one embodiment, the size of the separation mask layer 270 in the first direction X may be in a range of approximately 10 nm to 60 nm, and the size of the separation mask layer 270 in the second direction Y may be in a range of approximately 10 nm to 40 nm.

In one embodiment, the thickness of the sidewall spacing layer 280 may be in a range of approximately 10 nm to 25 nm.

In one embodiment, the extending direction (e.g., the length direction) of the second trench 290 may be parallel to the second direction Y. The width of the second trench 290 in the first direction X may be in a range of approximately 10 nm to 60 nm.

Compared to existing semiconductor devices and fabrication methods, the disclosed semiconductor device and fabrication method may demonstrate the following exemplary advantages.

According to the disclosed semiconductor device and fabrication method, the size of the top mask layer in the second direction is used to define the size of the separation mask layer in the second direction. Therefore, when the size of the top mask layer in the second direction is small, the size of the separation mask layer in the second direction is also small. The size of the separation mask layer in the first direction is limited by the size of the first trench in the first direction, and thus when the size of the first trench in the first direction is small, the size of the separation mask layer in the first direction is also small. Therefore, the size of the separation mask layer in both the first direction and the second direction is small, thereby satisfying the requirements of process design. Because the top mask layer may also extend to the second region along the first direction, the top mask layer only requires to be defined small in the second direction, and the size of the top mask layer in the first direction can be made large, such that the process difficulty for forming the top mask layer is reduced. During the process of forming the first trench, the top mask layer is used as a mask, such that when etching the first mask layer on the first region to form the first trench, the portion of the first mask layer on the first region and located under the top mask layer is retained to form the separation mask layer. Therefore, each first trench is thus divided into portions arranged in the second direction by the separation mask layer. Because the separation mask layer is formed from a portion of the first mask layer, the bonding strength between the separation mask layer and the bottom material may be strong, and thus the separation mask layer may not easily collapse. As such, the performance of the formed semiconductor device may be improved.

Further, prior to forming the first trench and the separation mask layer, doping ions are implanted into the portion of the first mask layer formed outside of the trench regions, while the doping ions are not implanted into the portion of the first mask layer formed in the trench regions. After forming the sidewall spacing layer and the separation filling layer, the portion of the first mask layer of the trench region located on both sides of the separation filling layer is removed to form a second trench in the first mask layer on the second region of the to-be-etched layer. According to the disclosed method, implanting the doping ions into the first mask layer formed outside of the trench regions is performed prior to forming the first trench, and thus during the process of implanting the doping ions into the first mask layer formed outside of the trench regions, the surface of the first mask layer is flat. As such, the photoresist material used in the process of implanting the doping ions into the first mask layer formed outside of the trench regions is not formed in the first trench, thereby conducive to the exposure process of the photoresist material. Moreover, prior to forming the first trench, the surface of the first mask layer is flat, which may be conducive to the exposure process of the photoresist material for defining the position of the first trench. As such, the performance of the formed semiconductor device may be improved.

Further, prior to removing the portion of the first mask layer formed in the trench region on both sides of the separation filling layer, a sidewall spacing layer is formed on the sidewall surfaces of the first trench. The sidewall spacing layer is used to separate the first trench from the adjacent second trench. The sidewall spacing layer may also be formed on the two sidewall surfaces of the separation mask layer in the second region. Therefore, the sidewall spacing layer formed on the sidewall surfaces of the separation mask layer is able to provide protection for the separation mask layer, such that during the process of forming the second trench, the separation mask layer may not easily collapse.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a to-be-etched layer, including a plurality of first regions and a plurality of second regions arranged alternately along a first direction, wherein for a first region of the plurality of first regions adjacent to a second region of the plurality of second regions, the first region and the second region adjoin each other;
   forming a first mask layer on the to-be-etched layer in both the plurality of first regions and the plurality of second regions;
   forming a top mask layer on the first mask layer on the first region of the to-be-etched layer, wherein a projection pattern of the top mask layer on a top surface of the first mask layer divides the first mask layer on the first region into portions arranged in a second direction perpendicular to the first direction, and the top mask layer extends to adjacent second regions along the first direction; and
   removing a portion of the first mask layer formed on the first region on both sides of the top mask layer to form a first trench in the first mask layer on the first region, wherein the first mask layer formed on the first region and located under the top mask layer forms a separation mask layer, and the separation mask layer divides the first trench into portions arranged in the second direction.

2. The method according to claim 1, wherein:
   the top mask layer is made of a material including SiO$_2$, SiN, TiO$_2$, TiN, AlN, or Al$_2$O$_3$.

3. The method according to claim 1, wherein:
   a size of the top mask layer in the second direction is in a range of approximately 10 nm to 40 nm.

4. The method according to claim 1, wherein:
   a size of the separation mask layer in the first direction is in a range of approximately 10 nm to 60 nm; and
   a size of the separation mask layer in the second direction is in a range of approximately 10 nm to 40 nm.

5. The method according to claim 1, wherein forming the top mask layer on the first mask layer on the first region includes:
   forming a blocking layer on the first mask layer, wherein a bock-layer opening is formed in the blocking layer and located on a portion of the first mask layer formed on the first region, and the blocking-layer opening extends to expose a portion of the first mask layer in the second region along the first direction;
   forming the top mask layer in the blocking-layer opening; and
   after forming the top mask layer, removing the blocking layer.

6. The method according to claim 1, wherein:
   the first mask layer is made of a material including amorphous silicon.

7. The method according to claim 1, wherein:
   the second region includes a trench region, and the method further includes:
   prior to forming the top mask layer, implanting doping ions into the first mask layer formed outside of the trench region;
   after removing the portion of the first mask layer formed on the first region on both sides of the top mask layer, removing the top mask layer;
   after removing the top mask layer, forming a separation trench in the first mask layer on the second region of the to-be-etched layer, wherein the separation trench divides the first mask layer formed in the trench region into portion arranged in the second direction;
   after forming the separation trench, forming a sidewall spacing layer on sidewall surfaces of the first trench;
   when forming the sidewall spacing layer, forming a separating filling layer in the separation trench, wherein for a first region and a second region adjacent to each other, the separation mask layer on the first region and the separating filling layer on the second region are separated from each other in the second direction;
   after forming the sidewall spacing layer and the separation filling layer, removing the first mask layer formed in the trench region on both sides of the separation filling layer to form a second trench in the first mask layer on the second region of the to-be-etched layer, wherein the separation filling layer divides the second trench into portions arranged in the second direction, and the sidewall spacing layer is exposed in the second trench and serves as a portion of sidewalls of the second trench.

8. The method according to claim 7, wherein:
   the doping ions include boron ions or arsenic ions.

9. The method according to claim 7, wherein:
a size of the separation filling layer in the second direction is smaller than or equal to two times of a thickness of the sidewall spacing layer.

10. The method according to claim 7, wherein:
a size of the separation filling layer in the second direction is in a range of approximately 10 nm to 40 nm.

11. The method according to claim 7, wherein:
a process for removing the first mask layer formed in the trench region on both sides of the doped separation layer is a wet etching process.

12. The method according to claim 11, wherein:
in the process of removing the first mask layer formed in the trench region on both sides of the doped separation layer, an etching rate of a portion of the first mask layer not implanted with the doping ions is larger than an etching rate of a portion of the first mask layer implanted with the doping ions.

13. The method according to claim 7, wherein:
the sidewall spacing layer and the separation filling layer are made of a material including $SiO_2$, $SiN$, $TiO_2$, $TiN$, $AlN$, or $Al_2O_3$.

14. The method according to claim 7, after forming the second trench, further including:
etching the to-be-etched layer exposed at a bottom of the first trench to form a first target trench in the to-be-etched layer;
etching the to-be-etched layer exposed at a bottom of the second trench to form a second target trench in the to-be-etched layer;
forming a first conductive layer in the first target trench; and
forming a second conductive layer in the second target trench.

\* \* \* \* \*